(12) United States Patent
Tran

(10) Patent No.: US 8,461,880 B2
(45) Date of Patent: Jun. 11, 2013

(54) BUFFER WITH AN OUTPUT SWING CREATED USING AN OVER-SUPPLY VOLTAGE

(75) Inventor: Huan Huu Tran, Santa Clara, CA (US)

(73) Assignee: Silicon Labs Spectra, Inc., Sunnyvale, CA (US)

( * ) Notice: Subject to any disclaimer, the term of this patent is extended or adjusted under 35 U.S.C. 154(b) by 0 days.

(21) Appl. No.: 12/752,864

(22) Filed: Apr. 1, 2010

(65) Prior Publication Data

US 2010/0253394 A1 Oct. 7, 2010

Related U.S. Application Data

(60) Provisional application No. 61/166,076, filed on Apr. 2, 2009.

(51) Int. Cl.
*H03B 1/00* (2006.01)

(52) U.S. Cl.
USPC ............................. 327/108; 327/112; 327/390

(58) Field of Classification Search
USPC ................. 327/108–112, 170, 374–377, 379, 327/389, 427, 390, 391, 589; 326/21–24, 326/82–84, 88, 89
See application file for complete search history.

(56) References Cited

U.S. PATENT DOCUMENTS

| | | | |
|---|---|---|---|
| 5,121,080 A | 6/1992 | Scott, III et al. | |
| 5,161,159 A | 11/1992 | McClure et al. | |
| 5,374,861 A | 12/1994 | Kubista | |
| 5,402,485 A | 3/1995 | Takato et al. | |
| 5,440,244 A | 8/1995 | Richter et al. | |
| 5,486,778 A | 1/1996 | Lou | |
| 5,512,845 A * | 4/1996 | Yuh | 326/88 |
| 5,550,496 A | 8/1996 | Desroches | |
| 5,570,037 A | 10/1996 | Llorens | |
| 5,870,296 A | 2/1999 | Schaffer | |
| 5,939,904 A | 8/1999 | Fetterman et al. | |
| 6,028,479 A | 2/2000 | Babanezhad | |
| 6,054,881 A | 4/2000 | Stoenner | |
| 6,147,520 A | 11/2000 | Kothandaraman et al. | |
| 6,160,723 A | 12/2000 | Liu | |
| 6,280,011 B1 | 8/2001 | Schloeman et al. | |
| 6,281,702 B1 | 8/2001 | Hui | |
| 6,300,802 B1 | 10/2001 | Smetana | |
| 6,373,297 B1 | 4/2002 | Lee et al. | |

(Continued)

OTHER PUBLICATIONS

U.S. Appl. No. 12/201,070, filed Aug. 29, 2008, entitled "Driver with Improved Power Supply Rejection," naming inventors Aaron J. Caffee and Jeffrey L. Sonntag.

(Continued)

*Primary Examiner* — Long Nguyen
(74) *Attorney, Agent, or Firm* — Abel Law Group, LLP

(57) ABSTRACT

A pre-drive circuit with an output buffer that may contain a bootstrap circuit is described. The bootstrap circuit may be configured to output a voltage level greater in magnitude than the supply voltage that the bootstrap circuit is coupled with. The pre-drive circuit may contain a timing circuit. The timing circuit may be configured to at least partially determine when the bootstrap circuit outputs a voltage greater in magnitude than the supply voltage. The pre-drive circuit may also contain a pre-drive buffer circuit. This pre-drive buffer circuit may be capable of three outputs: (1) logical zero, or roughly electrical ground; (2) logical one, or roughly the level of the voltage supply, and (3) an outputted voltage greater than the voltage supply.

19 Claims, 8 Drawing Sheets

U.S. PATENT DOCUMENTS

| | | | |
|---|---|---|---|
| 6,433,579 | B1 | 8/2002 | Wang et al. |
| 6,437,599 | B1 | 8/2002 | Groen |
| 6,445,223 | B1 | 9/2002 | Thilenius |
| 6,486,816 | B2 | 11/2002 | Seymour |
| 6,504,397 | B1 | 1/2003 | Hart et al. |
| 6,529,070 | B1 | 3/2003 | Nagaraj |
| 6,580,292 | B2 | 6/2003 | West et al. |
| 6,603,329 | B1 | 8/2003 | Wang et al. |
| 6,664,814 | B1 | 12/2003 | Evans et al. |
| 6,670,830 | B2 | 12/2003 | Otsuka et al. |
| 6,696,880 | B2 | 2/2004 | Pan et al. |
| 6,700,403 | B1 | 3/2004 | Dillon |
| 6,744,275 | B2 | 6/2004 | Chansungsan |
| 6,744,280 | B2 | 6/2004 | Morgan et al. |
| 6,760,381 | B2 | 7/2004 | Lu |
| 6,771,136 | B1 | 8/2004 | Reynolds |
| 6,812,734 | B1 | 11/2004 | Shumarayev et al. |
| 6,815,980 | B2 | 11/2004 | Kerr |
| 6,856,178 | B1 | 2/2005 | Narayan |
| 6,940,302 | B1 | 9/2005 | Shumarayev et al. |
| 6,963,219 | B1 | 11/2005 | Ghia et al. |
| 7,006,068 | B2 | 2/2006 | Haga |
| 7,012,450 | B1 | 3/2006 | Oner et al. |
| 7,034,574 | B1 | 4/2006 | Li |
| 7,088,181 | B1 | 8/2006 | Voo |
| 7,145,359 | B2 | 12/2006 | Hein et al. |
| 7,177,616 | B2 | 2/2007 | Connell et al. |
| 7,199,616 | B2 * | 4/2007 | Lu .................................. 326/83 |
| 7,199,641 | B2 | 4/2007 | Wei |
| 7,304,530 | B2 | 12/2007 | Wei et al. |
| 2002/0001207 | A1 | 1/2002 | Kishimoto et al. |
| 2003/0076149 | A1 | 4/2003 | Haga |
| 2003/0178975 | A1 | 9/2003 | Schuellein et al. |
| 2004/0095104 | A1 | 5/2004 | Brooks |
| 2004/0174215 | A1 | 9/2004 | Li et al. |
| 2005/0184805 | A1 | 8/2005 | Murakami |
| 2005/0212553 | A1 | 9/2005 | Best et al. |
| 2005/0237082 | A1 | 10/2005 | Shumarayev et al. |
| 2005/0285629 | A1 | 12/2005 | Hein et al. |
| 2006/0022753 | A1 | 2/2006 | Bonaccio et al. |
| 2006/0049865 | A1 | 3/2006 | Keskin |
| 2006/0082415 | A1 | 4/2006 | Gopinathan et al. |
| 2006/0091931 | A1 | 5/2006 | Leete |
| 2007/0285128 | A1 | 12/2007 | Singor |
| 2008/0055760 | A1 | 3/2008 | Tiwari et al. |
| 2008/0290911 | A1 * | 11/2008 | Williams .................. 327/109 |
| 2009/0284886 | A1 * | 11/2009 | Matsumoto ................ 361/93.7 |

OTHER PUBLICATIONS

Abo, Andrew M. and Gray, Paul R., "A 1.5-V, 10-bit, 14.3-MS/s CMOS Pipeline Analog-to-Digital Converter," IEEE Journal of Solid-State Circuits, vol. 34, No. 5, May 1999, pp. 599-606.

Boni, Andrea, et al., "LVDS I/O Interface for Gb/s-per-Pin Operation in 0.35-µm CMOS," IEEE Journal of Solid-State Circuits, vol. 36, No. 4, Apr. 2001, pp. 706-711.

Chen, Mingdeng, et al., "Low-Voltage Low-Power LVDS Drivers," IEEE Journal of Solid-State Circuits, vol. 40, No. 2, Feb. 2005, pp. 472-479.

Cho, Thomas Byunghak and Gray, Paul R., "A 10 b, 20 Msample/s, 35 mW Pipeline A/D Converter," IEEE Journal of Solid-State Circuits, vol. 30, No. 3, Mar. 1995, pp. 166-172.

Favrat, Pierre, et al., "A High-Efficiency CMOS Voltage Doubler," IEEE Journal of Solid-State Circuits, vol. 33, No. 3, Mar. 1998, pp. 410-416.

Goldie, John, "LVDS, CML, ECL-differential interfaces with odd voltages," retrieved from URL http://www.planetanalog.com/ Jan. 21, 2003, 9 pages.

Heydari, Payam, "Design Issues in Low-Voltage High-Speed Current-Mode Logic Buffers," GLSVLSI'03, Apr. 28-29, 2003, Washington, DC, USA, 6 pages.

Integrated Circuit Systems, Inc., "HiPerClockS (TM) Application Note, 3.3V LVPECL Driver Termination," Aug. 2, 2002, 7 pages, retrieved from URL www.icst.com/products/hiperclocks.html.

Ju, Jeff, "Interfacing LVDS with other differential-I/O types," retrieved from URL www.edn.com, Oct. 30, 2003, pp. 81-82, 84 and 86.

Kumric, Marijan, et al., "Digitally tuneable on-chip line termination resistor for 2.6Gbit/s LVDS receiver in 0.25µ standard CMOS technology," in Proceedings of the 27th European Solid-State Circuits Conference (ESSCIRC 2001), Sep. 18-20, 2001, pp. 241-244.

Lim, Khee Yong and Zhou, Xing, "MOSFET Subthreshold Compact Modeling With Effective Gate Overdrive," IEEE Transactions on Electron Devices, vol. 49, No. 1, Jan. 2002, pp. 196-199.

Ma, Jimmy, "Termination Schemes and Design Guidelines for 3.3V LVPECL Driver," Application Note #73, Pericom Semiconductor Corporation, San Jose, CA, 2 pages, retrieved May 19, 2004 from URL www.pericom.com.

Maxim High-Frequency/Fiber Communications Group, "Introduction to LVDS, PECL, and CML," Application Note: HFAN-1.0, Rev. 0, Sep. 2000, pp. i-14.

Micrel Semiconductor, "High-Speed PECL and LVPECL Termination," (no date) 2 pages, retrieved from URL www.micrel.com/solutions.shtml.

Pylarinos, L., et al., "A Low-Voltage CMOS Filter for Hearing Aids using Dynamic Gate Biasing," IEEE Canadian Conf. on Elec. and Comp. Eng., Toronto, May 2001, pp. 0183-0188.

San, Hao, et al., "Highly-Efficient Low-Voltage-Operation Charge Pump Circuits Using Bootstrapped Gate Transfer Switches," T.IEE Japan, vol. 120-C, No. 10, 2000, pp. 1339-1345.

Silicon Laboratories Product Sheet AN59, "Optimizing Design and Layout for the Si5318/20/21/64 Clock ICs," Rev. 1.0, Jun. 2005, 19 pages.

Von Herzen, Brian and Brunetti, Jon, "Virtex-E LVPECL Receivers in Multi-Drop Applications," XILINX Application Note: Virtex-E Family, XAPP237, v1.1, Feb. 24, 2000, 8 pages, retrieved from URL www.xilinx.com.

Wilson, Ron, "Leakage current leads 90-nm rogues' gallery," Electronic Engineering Times, May 19, 2003, www.EET.com, 4 pages.

Wu, Jieh-Tsorng, "MOS Charge Pumps for Low-Voltage Operation," IEEE Journal of Solid-State Circuits, vol. 33, No. 4, Apr. 1998, pp. 592-597.

Yang, Ken, "Modified LDO Regulator Sinks PECL-Termination Current," Planet Analog, Jun. 28, 2005, 4 pages, retrieved Sep. 2, 2005 from URL http://www.planetanalog.com/showArticle?articleID=164903593.

* cited by examiner

BUFFER WITH AN OUTPUT SWING CREATED USING AN OVER-SUPPLY VOLTAGE

CROSS REFERENCES TO RELATED APPLICATIONS

This Application claims the benefit of and is a non-provisional of U.S. Provisional Application No. 61/166,076, filed on Apr. 2, 2009, which is incorporated by reference in its entirety for all purposes.

BACKGROUND OF THE INVENTION

Embodiments of the present invention relate to circuits in general and, in particular, to output buffer circuits.

In electrical circuits, an output buffer may be used to isolate an input signal from an output signal. This may prevent the input signal from adversely affecting other circuits that the output signal interacts with. Further, the input signal may be weak. An output buffer may provide a stronger output signal, capable of driving a capacitive load. In some situations, the maximum output voltage of an output buffer is equal to the input voltage less the threshold voltage of the electrical device used to create the buffer. For example, such a situation may arise when the output buffer is a CMOS buffer, with the pull-up device of the driver circuit being an NMOS transistor. In such situations, the maximum output voltage is lower than the input voltage. In some situations, an increased output voltage may be desirable. For example, if the maximum output voltage is reduced, there may not be enough of a voltage swing—the difference between the high output voltage and the low output voltage—to properly interface with another circuit.

In some low power applications, a 0.8V output swing from a differential clock circuit may be desired. However, a traditional output buffer architecture may not create a large enough voltage swing for a functional differential clock signal when a lower voltage supply is used. For example, a nominal 1.5V power supply may have an output voltage as low as 1.4V. Such a situation may leave only 0.5V for the differential output swing.

Since the use of a low voltage supply may be desirable, a new design of output buffers is described that may allow for a low voltage supply to power the device, yet may create an output swing voltage greater than is possible using a standard circuit architecture.

BRIEF SUMMARY OF THE INVENTION

Devices, systems, and methods are described for a novel output buffer architecture. A pre-drive circuit may be integrated with an output buffer to achieve greater output voltage swings between the high and low outputted voltages. The pre-drive circuit's output may be greater than the supply voltage used to power both circuits due to capacitive charge coupling.

Therefore, in one embodiment of the output buffer, a pre-drive circuit with an integrated bootstrap circuit is described. The bootstrap circuit may be connected to a supply voltage. The bootstrap circuit may be configured to output a voltage level greater in magnitude than the supply voltage. The pre-drive circuit may also include a timing circuit. The timing circuit may be configured to at least partially determine when the bootstrap circuit outputs a voltage greater in magnitude than the supply voltage. The pre-drive circuit may also include a pre-drive buffer circuit. This pre-drive buffer circuit may be capable of three outputs: (1) logical zero, or roughly electrical ground; (2) logical one, or roughly the level of the voltage supply, and (3) an outputted voltage greater than the voltage supply.

In some embodiments, the timing circuit is a delay circuit. The delay circuit may be comprised of a series of logic gates, possibly buffers or inverters. In some embodiments, the output of the pre-drive buffer circuit may be coupled to a driver circuit. The driver circuit may be coupled to the gate of a MOSFET. The output of the pre-drive buffer circuit may be a buffered clock signal.

In some embodiments of the invention, an output buffer circuit is described. The output buffer may include a bootstrap circuit, coupled with the supply voltage, configured to output a voltage level greater in magnitude than the supply voltage. The output buffer may include a timing circuit, coupled with the bootstrap circuit, configured to at least partially determine when the bootstrap circuit outputs a voltage greater in magnitude than the supply voltage. The output buffer may include a pre-drive buffer circuit, coupled with the bootstrap circuit and the supply voltage configured to have at least three output states. The first state may be a state where the output of the pre-drive buffer circuit is coupled to electrical ground. The second state may be a state where the output of the pre-drive buffer circuit is coupled to the supply voltage. The third state may be a state where the output of the pre-drive buffer circuit is greater than the supply voltage. The output buffer may include a driver circuit coupled with the output of the pre-drive buffer circuit.

In some embodiments of the invention, a method for creating in a circuit a pre-drive voltage greater in magnitude than the circuit's supply voltage is described. The method may include receiving an input signal. The input signal's voltage may vary in magnitude. The method may include delaying the input signal, thereby creating a delayed input signal. The method may include generating an increased voltage signal, wherein the increased voltage signal is at least periodically greater in magnitude than the circuit's supply voltage. The method may also include generating an output signal using the input signal, the delayed input signal, and the increased voltage signal, wherein the output signal is at least periodically greater in magnitude than the supply voltage of the circuit.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components.

DETAILED DESCRIPTION OF THE INVENTION

Figure 1:
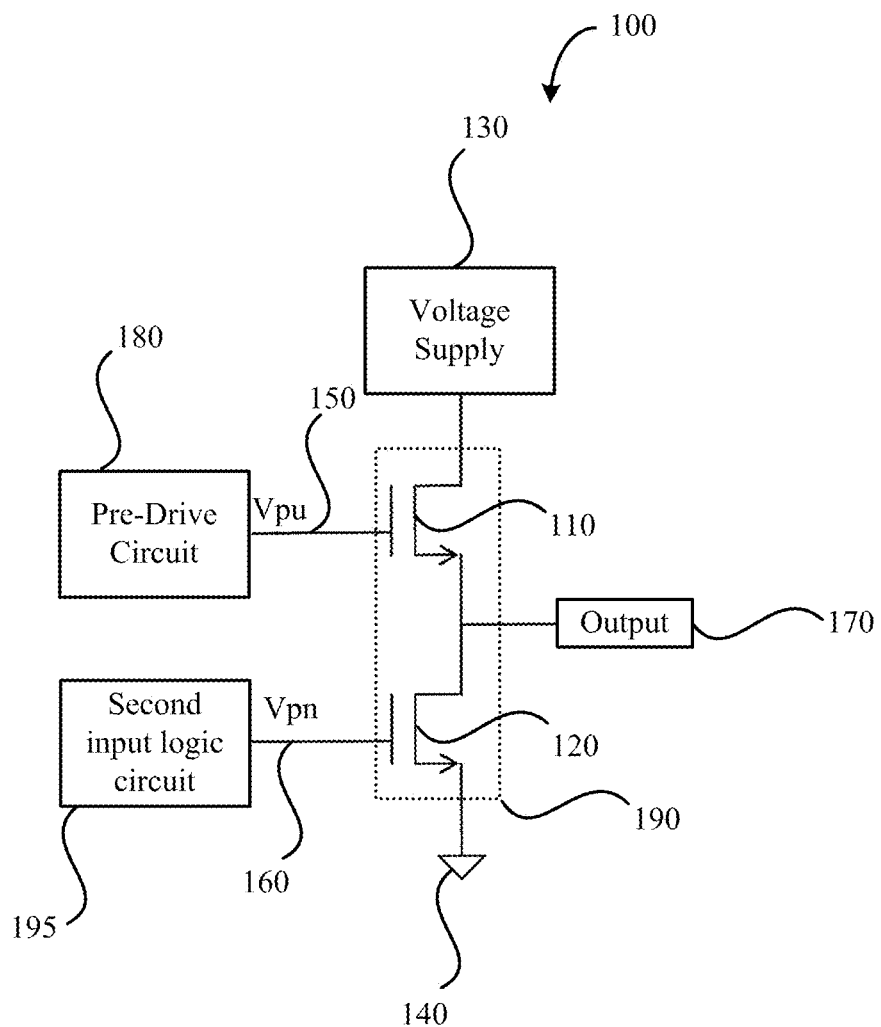
FIG. 1 illustrates a simplified block diagram of an embodiment of an output buffer having a pre-drive circuit.

Devices, systems, and methods are described for the implementation of a novel architecture for an output buffer with a pre-drive circuit to output an increased swing voltage.

This description provides example embodiments only, and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention.

Thus, various embodiments may omit, substitute, or add, various procedures or components as appropriate. For instance, it should be appreciated that in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner.

It should also be appreciated that the following systems, methods, and software may individually or collectively be components of a larger system, wherein other procedures may take precedence over or otherwise modify their application. Also, a number of steps may be required before, after, or concurrently with the following embodiments.

In some embodiments, an output buffer may be used to isolate an input signal from an output signal. This may prevent other circuits that the output signal connects to from affecting the input signal. The input signal may be weak. An output buffer may provide a stronger output signal, possibly capable of driving a capacitive load. In traditional output buffers, the maximum output voltage may be no greater than the input voltage reduced by the threshold voltage of the electrical device used to create the buffer. In such instances, the maximum output voltage may be lower than the input voltage. In some situations, this reduced output voltage may not be desirable. Therefore, a novel architecture for an output buffer integrated with a pre-drive circuit is described herein.

A pre-drive circuit may be integrated into an output buffer to create a greater output voltage swing. An output buffer with an integrated pre-drive circuit may be used as a clock buffer. Generally, this novel output buffer may be used to increase the maximum output voltage (and, thus, the voltage swing) from the output buffer. For example, to reduce power consumption, future ultra-mobile personal computers may rely on low voltage power supplies, such as 1.5V, for clock generators. An output from a clock generator may need roughly a 0.8V swing between the logical low and logical high values of the output, to properly interface with other circuits. An output buffer integrated with a pre-drive circuit may output a large enough voltage swing to properly interface with other circuits.

In some embodiments, the output buffer may be two transistors integrated with a pre-drive circuit 180. FIG. 1 illustrates a simplified block diagram of an output buffer 100. The output buffer 100 may include a first transistor 110 and a second transistor 120. The first transistor 110 and second transistor 120 may be referred to collectively as a drive circuit 190. The transistors 110 and 120 may be PMOS or NMOS MOSFETs. In the illustrated embodiment, transistors 110 and 120 are both NMOS MOSFETs. The drain of the first transistor 110 may be connected to a voltage supply 130. The voltage supply 130 may be any constant voltage source. In some embodiments, the voltage supply 130 may be a 1.5V source. The source of the first transistor 110 may be connected to the drain of the second transistor 120. The source of the second transistor 120 may be connected to electrical ground 140.

The gate of transistor 110 may be connected with the output 150 of the pre-drive circuit 180. The output 150 of the pre-drive circuit 180 may be referred to as $V_{PU}$. The gate of transistor 120 may be connected with the output of a circuit similar to pre-drive circuit 180. In some embodiments, the gate of transistor 120 may be connected with the output of traditional CMOS logic circuitry. Signal 160 may connect to the gate of the second transistor 120. The signal 160 may be referred to as $V_{PN}$. $V_{PN}$ may be created by a second input logic circuit 195. Second input logic circuit may be similar to pre-drive circuit 180, may be a clock generator, or may be some other circuit. Output 170 of the output buffer 100 may be the connection between the source of the first transistor 110 and the drain of the second transistor 120. The output 170 of the output buffer 100 may be connected to another circuit on the same integrated circuit chip, or it may be routed to an output pin of the integrated circuit chip and routed to some other integrated circuit chip or device.

The voltage level of $V_{PU}$ 150 and the signal 160 determine what the voltage may be on output 170. The voltage of the output 170 may be determined by the following formula: $V_{OH}=V_{PU}-V_{TN}$. The threshold voltage ($V_{TN}$) of a NMOS MOSFET, such as transistor 110, connected to voltage supply 130 may be 0.9V. Therefore, as $V_{PU}$ increases, output 170 may also increase.

Figure 2:
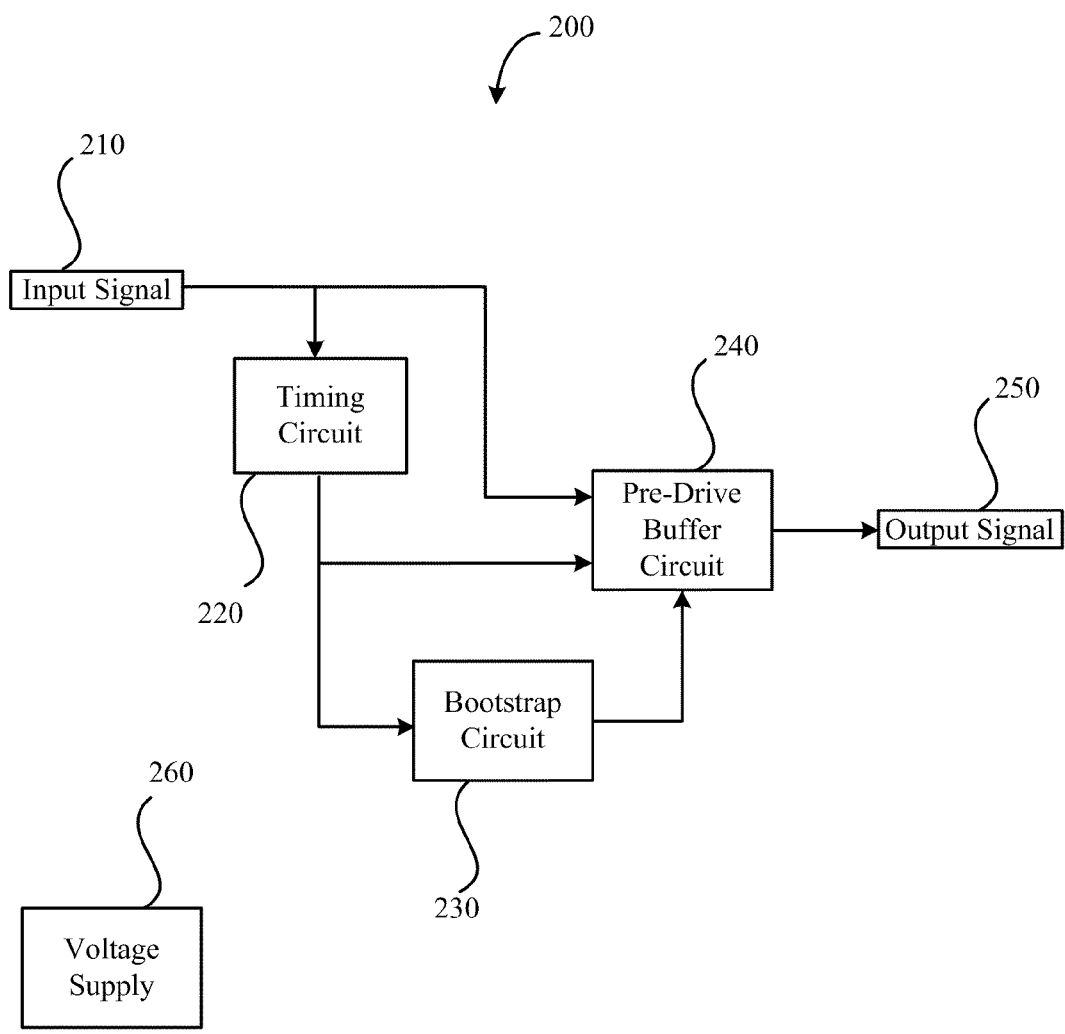
FIG. 2 illustrates a simplified block diagram of an embodiment of a pre-drive circuit.

The pre-drive circuit 180 may create a voltage on $V_{PU}$ 150 greater in magnitude than the voltage of the voltage supply 130. FIG. 2 illustrates a simplified block diagram of an embodiment of a pre-drive circuit 200. In this embodiment, each component is powered by the same voltage supply 260. The pre-drive circuit 200 of FIG. 2 may be the pre-drive circuit 180 of FIG. 1, or it may be used elsewhere to provide similar functionality with other circuits. The illustrated embodiment of pre-drive circuit 200 includes as components: a timing circuit 220, a bootstrap circuit 230, and a pre-drive buffer circuit 240. The input signal 210 may be a logical signal, with a value of either '1' or '0'. In the illustrated embodiment, the input signal 210 may be a clock signal generated by an oscillator, or any other logic signal generated by another device. The input signal 210 may originate on the same integrated circuit chip as the pre-drive circuit, or the input signal 210 may originate from another source outside of the integrated circuit chip.

The input signal 210 may be connected to a pre-drive buffer circuit 240. The pre-drive buffer circuit 240 may include logic circuitry. In the illustrated embodiment, the pre-drive buffer circuit 240 may include transistors and logic circuits. The transistors of the pre-drive buffer circuit 240 may be MOSFETs.

The input signal 210 may also be connected to a timing circuit 220. In the illustrated embodiment, the timing circuit 220 may be a delay circuit. The output of the timing circuit 220 may be the input signal 210 after a time delay. In some embodiments, the timing circuit 220 consists of logic circuitry, such as buffers or inverters. In some embodiments, a combination of logic circuits may be used to create the delay. The output signal of the timing circuit 220 may be a time-delayed and inverted input signal 210. In some embodiments, a long trace may be the timing circuit 220. The timing circuit 220 may connect to the pre-drive buffer circuit 240 and a bootstrap circuit 230.

The bootstrap circuit 230 may be capable of outputting a voltage greater than the voltage of the voltage supply it is connected to. Bootstrap circuit 230 may be connected to voltage supply 260. The bootstrap circuit 230 may output a voltage greater than the voltage of voltage supply 260. The bootstrap circuit 230 may include logic circuits and a device capable of capacitive charge sharing. In the illustrated embodiment, the bootstrap 230 circuit may include an inverter and a NMOS MOSFET. The timing circuit 220 may at least partially determine when the bootstrap circuit 230 is outputting a voltage greater than the voltage of voltage supply 260. The output of the bootstrap circuit 230 may be connected to the pre-drive buffer circuit 240.

The pre-drive buffer circuit 240 may be connected to the input signal 210, the timing circuit 220, and the bootstrap circuit 230. The pre-drive buffer circuit 240 may generate three output voltage levels: (1) logical zero, which may substantially be electrical ground; (2) logical one, which may substantially be the voltage of the voltage supply 260; and (3) a voltage greater in magnitude than the voltage of the voltage supply 260. The pre-drive buffer circuit 240 may include logic circuitry and transistors. In some embodiments, the transistors may be MOSFETs. The pre-drive buffer circuit 240 may produce an output signal 250. The output signal 250 may be any of the three values described in relation to the output of the pre-drive buffer circuit 240. The output signal 250 may be output signal 150 of pre-drive circuit 180 in FIG. 1.

Figure 3:
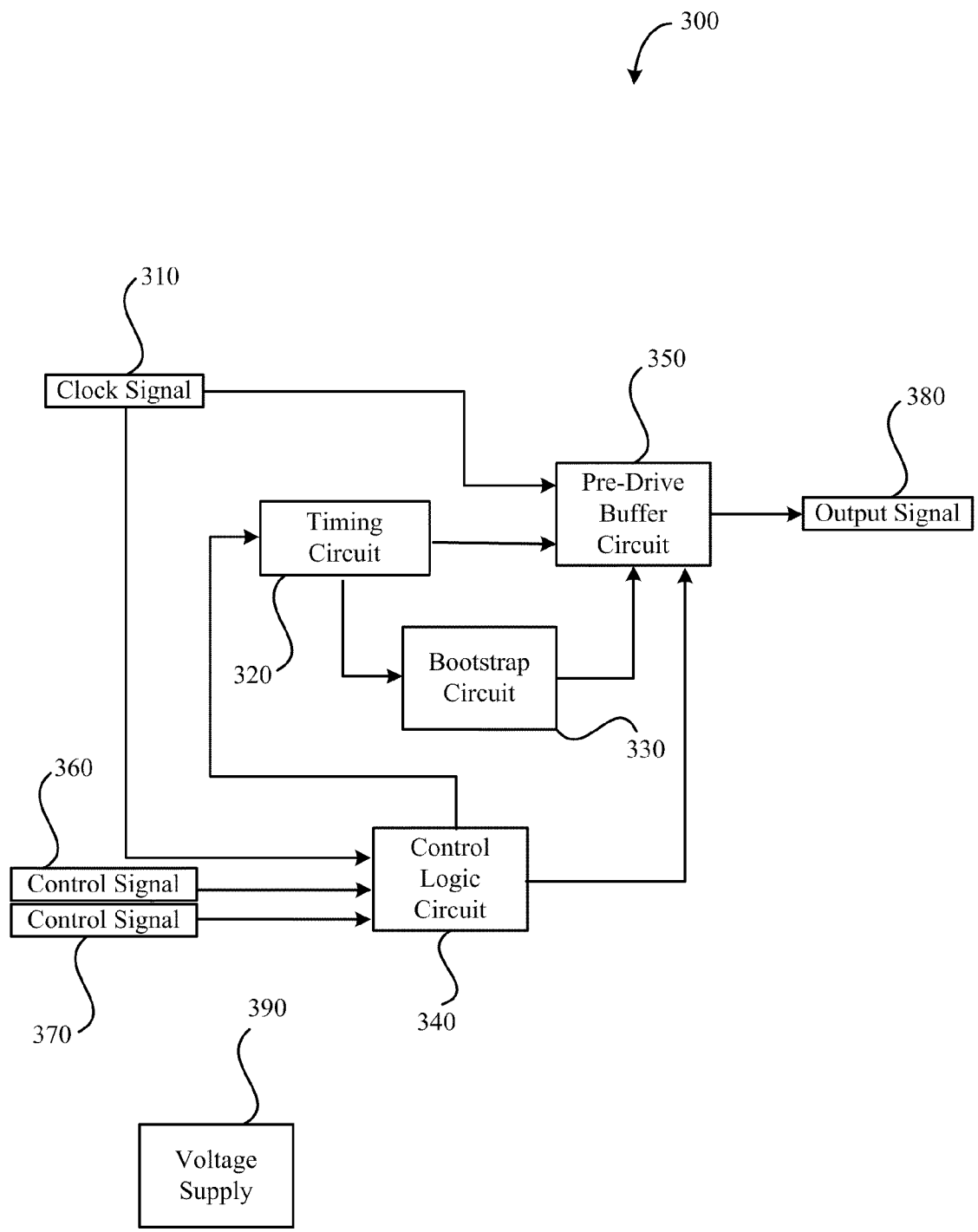
FIG. 3 illustrates a simplified block diagram of another embodiment of a pre-drive circuit.

Some embodiments of a pre-drive circuit may include additional circuitry. FIG. 3 illustrates a simplified block diagram of an embodiment of a pre-drive circuit 300. Pre-drive circuit 300 may include: a timing circuit 320, a bootstrap circuit 330, a pre-drive buffer circuit 350, control logic circuit 340, a number of control signals (two pictured here: 360 and 370), an output signal 380, and a voltage supply 390. The pre-drive circuit 300 of FIG. 3 may be used as the pre-drive circuit 200 of FIG. 2, the pre-drive circuit 180 of FIG. 1, or it may be used elsewhere to provide similar functionality with other circuits. In the illustrated embodiment, voltage supply 390 supplies each component in the pre-drive circuit 300 with the same voltage. A clock signal 310 may be used as an input to the pre-drive circuit 300. The clock signal 310 may be same as the input signal 210 of FIG. 2 or it may be a different input signal. The timing circuit 320, bootstrap circuit 330, and the pre-drive buffer circuit 350 may be the same components as in FIG. 2. The illustrated embodiment of pre-drive circuit 300 may contain control logic circuit 340. Control logic circuit 340 may have the clock signal 310 and additional control signals 360 and 370 as inputs. In the illustrated embodiment, the control logic circuit 340 has a first control signal 360 and a second control signal 370 as inputs. The control logic circuit 340 may consist of logic circuitry. The control logic circuit 340 may cause the pre-drive buffer output 350 to output a constant state depending on the value of the input control signals.

The control signals 360 and 370 may be signals from another circuit on the integrated circuit chip, or they may be routed to the control logic circuit 340 from outside of the integrated circuit chip. The control signals 360 and 370 may be active high or active low. In the illustrated embodiment, the control signals 360 and 370 represent logic values. In some embodiments, control signal 360 having a logical value of '0' may result in the control logic circuit 340 causing the pre-drive buffer circuit 350 to remain in a particular state, such as connecting the output driver signal 380 to electrical ground. In the illustrated embodiment, the second control signal 370 having a logical value of '0' may result in the control logic circuit 340 causing the output 380 to float.

Figure 4:
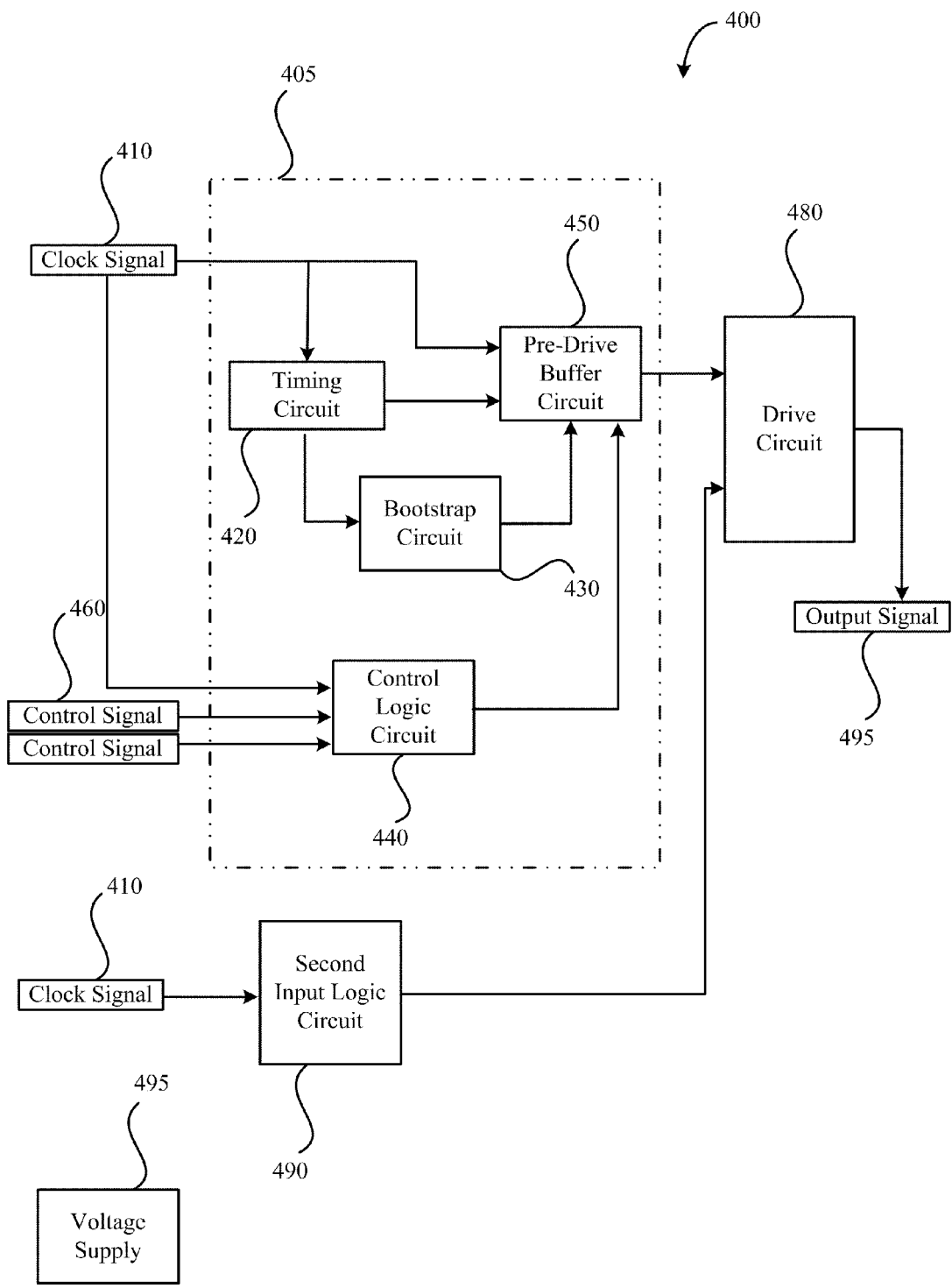
FIG. 4 illustrates a simplified block diagram of another embodiment of an output buffer having a pre-drive circuit.

In the illustrated embodiment, the pre-drive circuit 300 of FIG. 3 may be incorporated as pre-drive circuit 405 in FIG. 4 with drive circuit 480 to create output buffer 400. Pre-drive circuit 405 may be the pre-drive circuit of either FIG. 2 or FIG. 3, or it may be used elsewhere to provide similar functionality with other circuits. The pre-drive circuit 405 may have a timing circuit 420, a bootstrap circuit 430, and a control logic circuit 440 as in FIGS. 2 and 3. The input signals may be the same as in FIGS. 2 and 3: clock signal 410 and control signals 460. In the illustrated embodiment, the output for the pre-drive buffer circuit 450 may be connected to drive circuit 480. The drive circuit 480 may consist of a number of transistors. The transistors may be MOSFETs. In the illustrated embodiment, the drive circuit 480 may be the drive circuit 190 output driver 100 in FIG. 1. Similar to FIGS. 1-3, a voltage supply 495 may provide a constant voltage to each component.

The drive circuit 480 may have a second input. This input may be connected to a second input logic circuit 490. Second input logic circuit 490 may be similar to a pre-drive circuit of FIGS. 2-4. The second input logic circuit 490 may produce an inverted output compared to the output of pre-drive circuit 405. The second input logic circuit 490 may lack a bootstrap circuit. The clock signal 410 may serve as an input to the second input logic circuit 490. The second input logic circuit 490 may consist of transistors and logic gates. The transistors may be MOSFETs.

Figure 5:
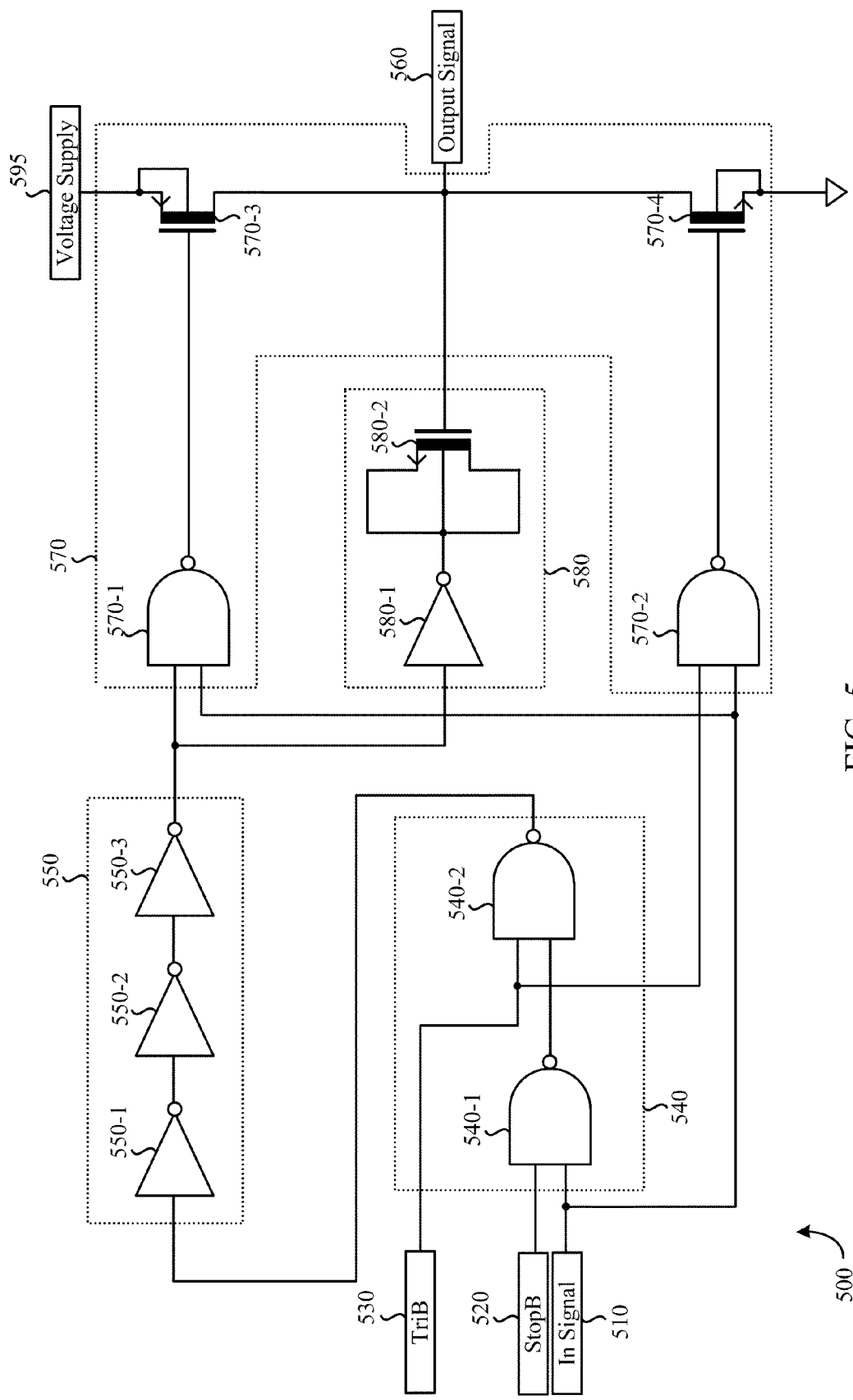
FIG. 5 illustrates an embodiment of a pre-drive circuit implemented using logic gates and MOSFETs.

Each of the block diagram illustrations of the pre-drive circuits in FIGS. 2-4 may be implemented using logic circuitry and MOSFETs as illustrated in FIG. 5. Alternatively, the pre-drive circuit 500 of FIG. 5 may be used elsewhere to provide similar functionality with other circuits. In the embodiment illustrated in FIG. 5, a voltage supply 595, possibly of 1.5V, may supply each component with a source voltage. For the sake of clarity, any connections between the components of pre-drive circuit 500 and the voltage supply 595 have been omitted. NMOS MOSFET 580-2 may not be directly connected to the voltage supply 595. The input 510 may be the clock signal described in FIGS. 2-4, or it may be a different clock signal. Signals STOPB 520 and TRIB 530 may be the control signals of FIGS. 3 and 4, or different control signals. In the illustrated embodiment, STOPB 520 and TRIB 530 have a logical value of '1' during normal operation. When each of these signals has a logical value of '1,' output of the pre-drive circuit 500 may be dependent on the input 510. NAND gate 540-1 and NAND gate 540-2 may be part of control logic circuit 540. This control logic circuit may be the same control logic circuit illustrated in FIGS. 3 and 4, or it may be a different control logic circuit. If STOPB 520 and TRIB 530 are a constant logical '1', NAND gates 540 and 550 may function as inverters on the input signal 510, with the output from NAND 540 being logically the same as input 510. The output from gate 540-2 may be input to the timing circuit 550. In the illustrated embodiment, the timing circuit 550 may be a series of inverters. In some embodiments, the amount of delay desired may be determined by adjusting the number of inverters present. In the embodiment pictured, three inverters are present: 550-1, 550-2, and 550-3. The output from the timing circuit 550 may be the input signal to the timing circuit 550 delayed and inverted.

The output from the timing circuit 550 may be connected to the pre-drive buffer circuit 570 and the bootstrap circuit 580. In the illustrated embodiment, the pre-drive buffer circuit 570 includes two NAND gates, 570-1 and 570-2, and two MOSFETs, 570-3 and 570-4. In the illustrated embodiment, the first MOSFET 570-3 may be a PMOS MOSFET, and the second MOSFET 570-4 may be an NMOS MOSFET. The pre-drive buffer circuit 570 may be the pre-drive buffer circuit of FIGS. 2-4, or it may be a different pre-drive buffer circuit. The bootstrap circuit 580, which may be the bootstrap circuit of FIGS. 2-4, or a different bootstrap circuit, includes an inverter 580-1 and a NMOS MOSFET 580-2. The NMOS MOSFET 580-2 may be used to take advantage of capacitive charge sharing. The drain, base, and source of NMOS MOSFET 580-2 may be connected to the output of the inverter 580-1; the gate may be connected to the output drive signal 560 of the pre-drive buffer circuit 570. In other embodiments, the gate may be connected to the output of the inverter 580-1 and the base, drain, and source may be connected to the pre-drive buffer circuit 570 at output 560.

The output signal 560 of pre-drive circuit 500 may have three states: (1) the logical value may be '0', which may be substantially electrical ground; (2) the logical value may be '1', which may be substantially the voltage supply level; and (3) where the output signal 560 may be at a voltage level above the voltage supply level. A description of each state follows.

In this first state, the input signal 510 may be logically '0', and has been for longer than the length of the delay in the timing circuit 550. The output of the delay circuit may be a logical '1', because of the odd number of inverters. The NAND gate 570-1 may output a '1', causing PMOS MOSFET 570-3 to be open. Likewise, NAND gate 570-2 may output a '1', causing NMOS MOSFET 570-4 to be closed. Therefore, the output 560 may be tied to electrical ground through 570-4.

For a period of time after the input signal 510 transitions from '0' to '1', the value of the input signal 510 and the output of the delay circuit may not be the same. The input signal 510 may be '1' and the output of timing circuit 550 may also be '1'. Therefore, the output of the NAND gate 570-1 may be '0'. This may cause the PMOS MOSFET 570-3 to be closed, and may connect the output 560 to the voltage supply 595. The output of NAND 570-2 may also be '0', therefore NMOS MOSFET 570-4 may be open.

After a time, the input signal 510 may have propagated through the timing circuitry 550, and the output from the timing circuit 550 may be '0'. At this time, the output of the NAND 570-1 may change to '1'. Both 570-3 and 570-4 may then be open, leaving the output 560 floating. The logical '0' output of the timing circuit 550 may cause the output of inverter 580-1 be logical '1.' The capacitive charge effect on MOSFET 580-2 may cause the voltage on the floating output 560 to be increased. In some embodiments, an increase of 200 mV may occur on the output 560; in other embodiments, the output voltage may be increased by 300 mV. Greater or smaller increases of voltage may also be possible in some embodiments. The amount of increase in the output voltage and the capacitance of MOSFET 580-2 may be adjusted by changing the size and design of MOSFET 580-2, as is known to those of ordinary skill in the art.

When the input signal 510 transitions from '1' to '0', the timing circuit 550 may not affect the output. Once the input signal 510 is a logical zero, an input to each of NANDs 570-1 and 570-2 may be '0' with the output from both gates 570-1 and 570-2 being '1'. This results in PMOS MOSFET 570-3 being open, and NMOS MOSFET 570-4 being closed. Accordingly, output 560 may be tied to electrical ground.

Not pictured in FIG. 5 is a drive circuit; output 590 may connect to such a drive circuit. A drive circuit such as that in FIG. 4 or FIG. 1 may be used on a different drive circuit, with output 590 connected to an input of the drive circuit. Due to the increased voltage of the output 590 when in the third described state, the maximum magnitude of the output voltage of the output buffer is increased. For example, this pre-drive circuit allows the output buffer 100 of FIG. 1 to achieve a 0.8V swing between its high output and low output while the output buffer 100 has a 1.5V voltage supply. This design is functional for other voltage supply levels also.

Figure 6:
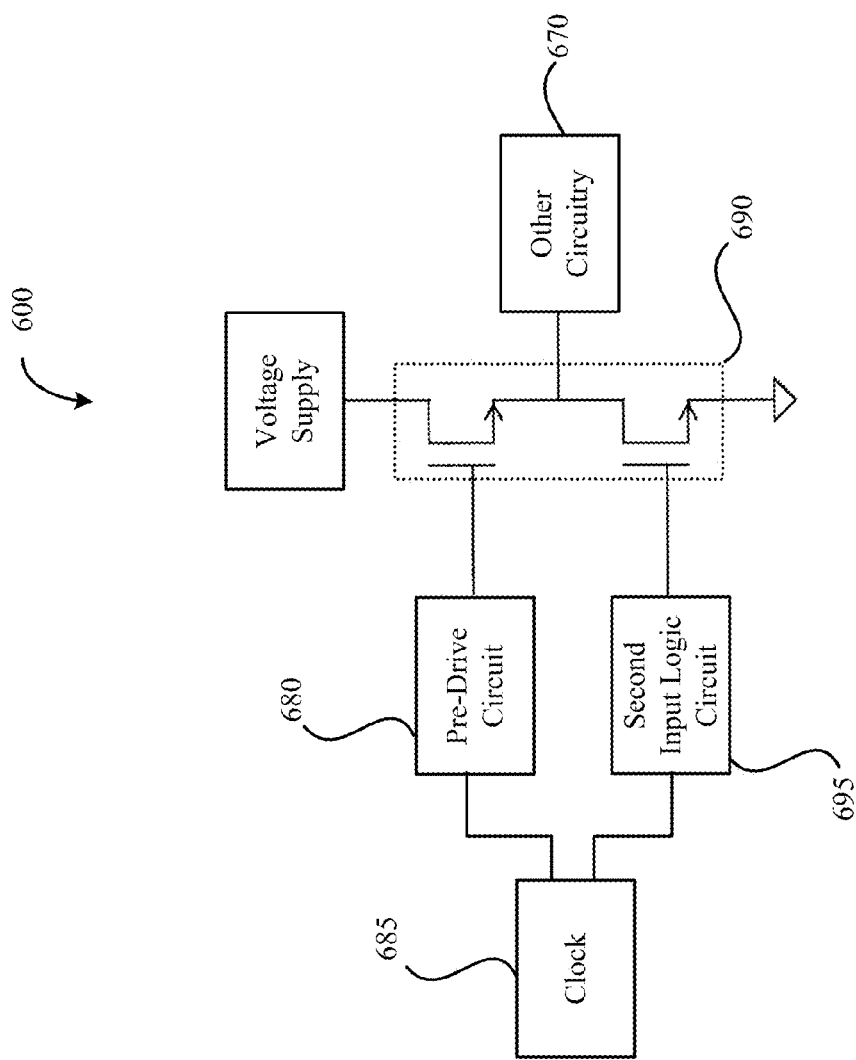
FIG. 6 illustrates a simplified block diagram of an embodiment of an output buffer having a pre-drive circuit connected with other circuitry.

A pre-drive circuit, such as pre-drive circuit 500, or any of the other previously described pre-drive circuits, may be implemented as part of a larger circuit. FIG. 6 illustrates an embodiment of a pre-drive circuit implemented with a drive circuit as part of a larger circuit 600. In circuit 600, pre-drive circuit 680 and second input logic circuit 695 are connected to drive circuit 690. Drive circuit 690 may be any of the previously detailed drive circuits, such as drive circuit 190 of FIG. 1. Serving as an input to both pre-drive circuit 680 and second input logic circuit 695 is clock 685. Clock 685 may be a circuit that generates an oscillating output. Other inputs besides clock 685 may be possible.

The output from drive circuit 690 may be connected to other circuitry 670. This other circuitry 670 may be part of circuit 600 or may be part of a different circuit. Other circuitry 670 may be located on a different circuit board or integrated circuit chip than circuit 600. Other circuitry 670 may use the output from drive circuit 690 as a clock signal.

Figure 7:
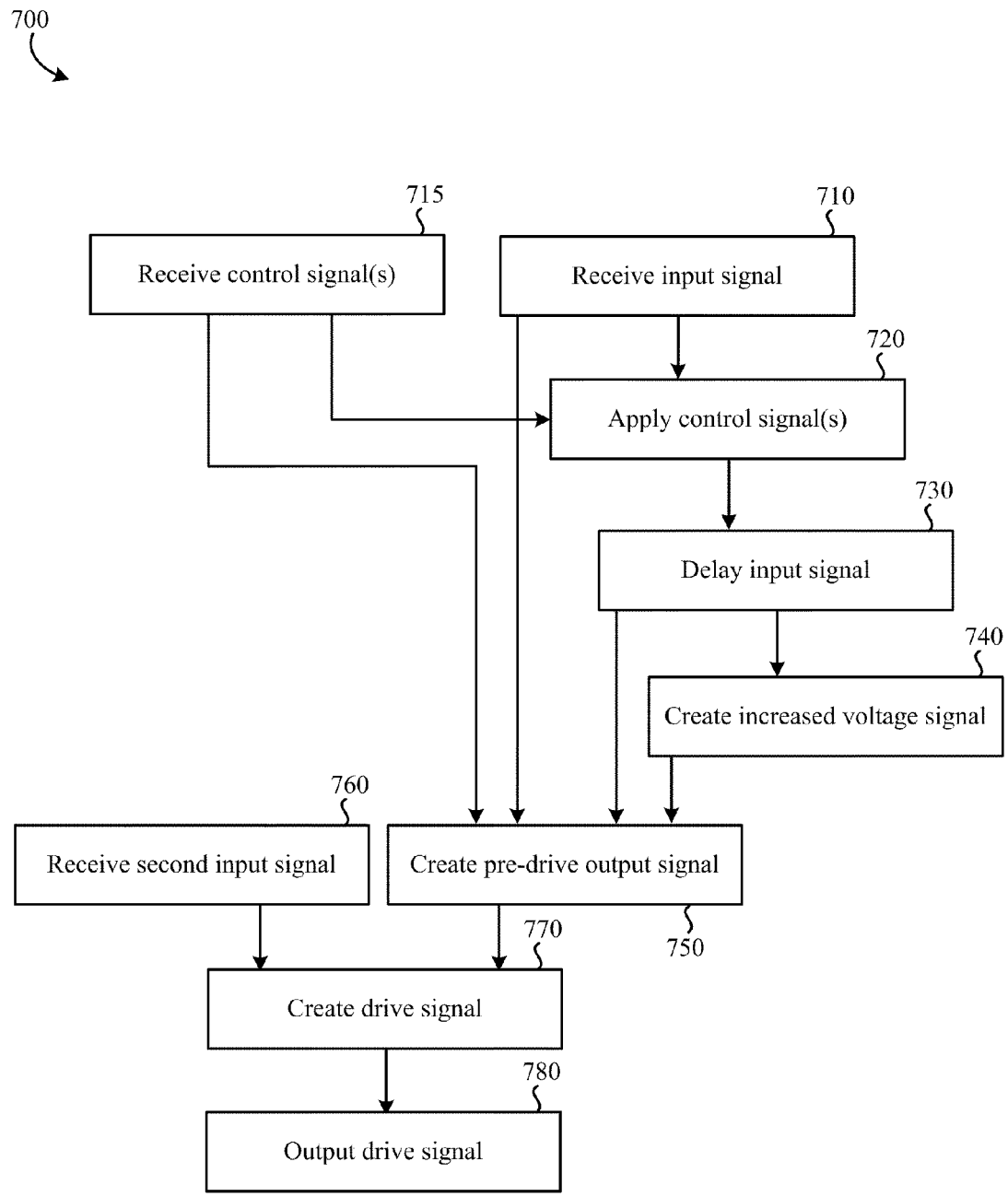
FIG. 7 illustrates a simplified flowchart of a method for signal generation by an output buffer having a pre-drive circuit.

The pre-drive circuits of FIGS. 1-6, along with the drive circuits of FIGS. 1, 4, and 6 may perform various steps to generate an output voltage with an increased voltage swing. FIG. 7 illustrates a simplified flowchart of a method 700 for generating various signals by an output buffer having a pre-drive circuit. At block 710, an input signal may be received. Such an input signal may be a clock signal, or some other logical input signal.

At block 715, one or more control signals may be received by the output buffer. The one or more control signals may be received at the same time or a different time from when input signal 710 was received. Such control signals may be the STOPB 520 and TRIB 530 signals of FIG. 5, or may be different control signals. Such control signals may represent logic values. At block 720, one or more of the control signals may be applied to the input signal. One or more of the control signals may force the input signal to a particular logic value or otherwise manipulate the input signal.

At block 730, the input signal, after the one or more control signals have been applied, may be delayed for an amount of time to create a delayed input signal. Such a delay may be generated by using a series of inverters or buffers. For example, as shown in FIG. 5, timing circuit 550 is a series of inverters. The greater the number of inverters or buffers used, the greater the delay of the input signal. As those with skill in the art will understand, various other ways of delaying the input signal to create a delayed input signal are possible.

At block 740, an increased voltage signal may be generated. Such an increased voltage signal may be generated from the delayed input signal as an input. Such an increased voltage signal may be created by circuitry that is capable of generating a voltage level greater in magnitude than the supply voltage it is connected to. For example, bootstrap circuit 580 of FIG. 5, is an example of circuitry capable of generating a signal with a voltage level greater than its supply voltage level. This increased voltage signal may only periodically or intermittently have a voltage level greater in magnitude than the supply voltage level.

At block 750, a pre-drive output signal may be created. This pre-drive output signal may periodically or intermittently be greater in magnitude than the supply voltage. To generate the pre-drive output signal, one or more control signals (which may be the same or different from the controls signal(s) applied at block 720), the input signal, the delayed input signal, and/or the increased voltage signal may be used. For example, pre-drive buffer circuit 570 of FIG. 5 is a possible embodiment of circuitry capable of using control signals, an input signal, a delayed input signal, and an increased voltage signal to create a pre-drive output signal.

At block 760, a second input signal may be received. This second input signal may be received at the same time or at a different time from when the input signal was received at block 710. This second input signal may represent a clock signal, another pre-drive output signal, or some other signal.

At block 770, the second input signal and the pre-drive output signal may be used to generate a drive signal 770. Such a drive signal may be generated by a drive circuit, such as drive circuit 190 of FIG. 1 or drive circuit 480 of FIG. 4. Some other drive circuit may also be used. The output drive signal may have an increased voltage swing due to the pre-drive output signal occasionally having a voltage level greater than the supply voltage.

At block 780, the drive signal may be outputted to some other circuitry. This other circuitry, such as other circuitry 670 of FIG. 6, may use the drive signal as a clock signal.

Figure 8:
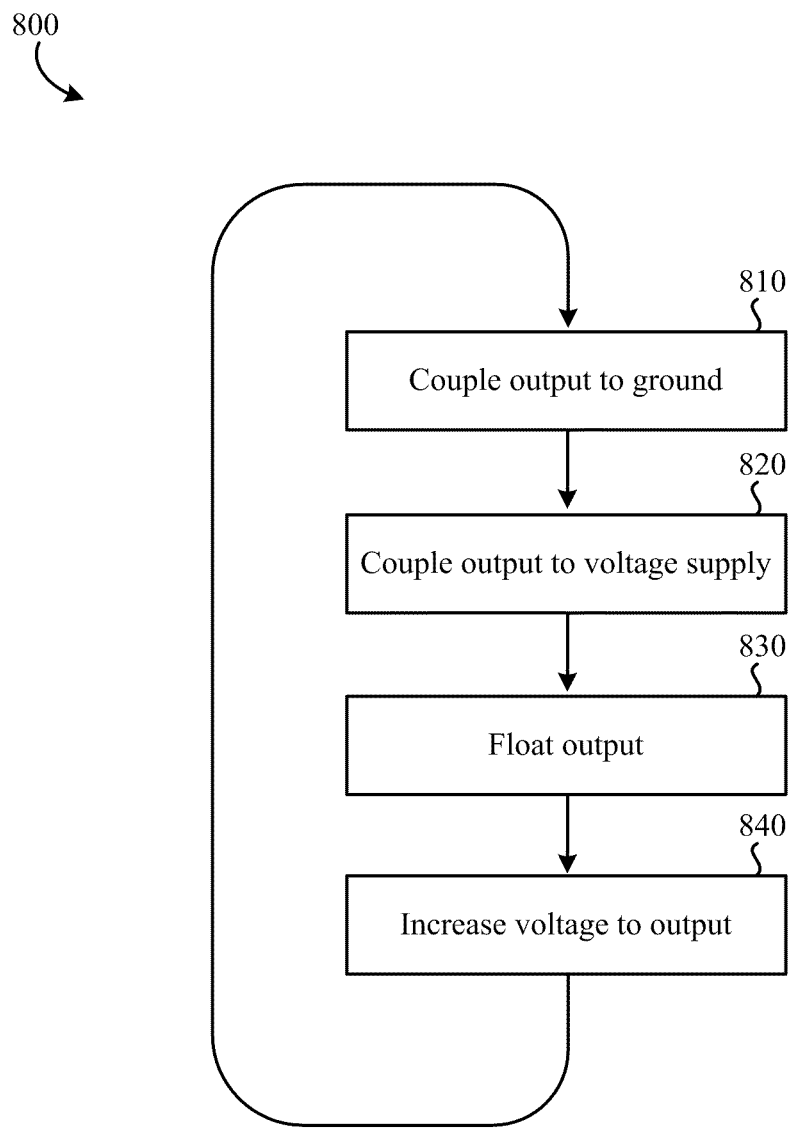
FIG. 8 illustrates a simplified flowchart of signal generation by a pre-drive buffer circuit.

FIG. 7 illustrates a pre-drive buffer output signal being created at block 750. FIG. 8 illustrates an embodiment 800 of a method of how the input signal, the delayed input signal, the increased voltage signal, and/or the control signals may be used to generate the pre-drive output signal. Such a method may be used with any of the previously described pre-drive buffer circuits, or possibly other pre-drive buffer circuits. Initially, at block 810, the input signal may be a logical '0.' This state of the input signal may cause the output of the pre-drive buffer to be tied to ground. For example, referring to FIG. 5, this may mean that MOSFET 570-4 is closed and MOSFET 570-3 is open.

The output signal of the pre-drive buffer may remain in this state until the input signal changes to a logical '1.' At block 820, the input signal may change to '1.' At this time, the input signal may not yet have propagated through the delay circuit. This may cause the output of the pre-drive buffer to be tied to the voltage supply instead of ground. Again, referring to the embodiment of FIG. 5 as an example, MOSFET 570-4 may be open and MOSFET 570-3 may be closed.

Once the delayed input signal has propagated, at block 830, the output of the pre-drive buffer may float. Referring to FIG. 5, in such an embodiment, MOSFET 570-4 and 570-3 may both be open. At the same time the output is floated or sometime thereafter, the output voltage may be increased at block 840 by an increased voltage being applied to the output of the pre-drive buffer circuit. This may occur via a bootstrap circuit, such as bootstrap circuit 580 of FIG. 5. This bootstrap circuit may apply an increased voltage to the output of the pre-drive buffer.

This increased voltage may remain on the output of the pre-drive buffer until the input changes state to a logical '0.' This may cause the output to be tied to ground and return to block 810 and repeat the process.

It should be noted that changing the state of any of the control signals may cause the output of the pre-drive buffer to change to a particular state at any point during method 800 regardless of the state of the input signal, delayed input signal, and/or the increased voltage signal.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A circuit comprising:
   a timing circuit configured to generate a delayed signal in response to an input signal;
   a first pre-drive buffer portion configured to provide a first voltage level to a node in response to a first control signal based on the input signal and the delayed signal; and
   a second pre-drive buffer portion configured to provide a second voltage level to the node in response to a second control signal based on the input signal; and
   a bootstrap circuit configured to boost the voltage level of the node from the first voltage level to a bootstrapped voltage level in response to a third control signal based on the input signal.

2. The circuit of claim 1, wherein the timing circuit is a delay circuit.

3. The circuit of claim 2, wherein the delay circuit is comprised of a series of logic gates.

4. The circuit of claim 1, wherein the input signal is a clock signal, and the delayed signal generated by the timing circuit is a buffered clock signal.

5. The circuit of claim 1, wherein the bootstrap circuit is comprised of a MOSFET, wherein a source of the MOSFET is coupled to a drain of the MOSFET.

6. The circuit of claim 5, wherein the MOSFET is coupled to generate a capacitive charge, and wherein the bootstrapped voltage level is based on the capacitive charge.

7. The circuit as recited in claim 5, wherein the gate of the MOSFET is coupled to the node.

8. The circuit as recited in claim 5, wherein a version of the third control signal is provided to the drain and the source of the MOSFET.

9. The circuit of claim 1, wherein the timing circuit is a delay circuit comprised of a series of inverters.

10. The circuit of claim 1, further comprising a control logic circuit, wherein the control logic circuit receives at least a first control signal and has an output coupled to the timing circuit.

11. The circuit of claim 1, further comprising:
an input portion coupled to generate a signal in response to a first control signal, a second control signal, and the input signal,
wherein the timing circuit is coupled to receive the signal from the input portion and further coupled to generate the delayed signal based on the signal received from the input portion.

12. The circuit as recited in claim 1, wherein the first pre-drive buffer portion and the second pre-drive buffer portion are configured to cause the node to float and the voltage level of the node is boosted to the bootstrapped voltage level, by the bootstrap circuit, while the node floats.

13. The circuit as recited in claim 1, wherein the first voltage level is provided by a first power supply node and the second voltage level is provided by a ground voltage node, the first voltage level exceeding the second voltage level and the bootstrapped voltage level exceeding the first voltage level.

14. The circuit as recited in claim 1, wherein the first pre-drive buffer portion comprises a first device of a first type coupled between the node and the first power supply node and the second pre-drive buffer portion comprises a second device of a second type coupled between the node and the ground voltage node.

15. The circuit as recited in claim 14, wherein the first device includes a gate terminal configured to receive the first control signal and the second device includes a gate terminal configured to receive the second control signal.

16. The circuit as recited in claim 15, wherein the second control signal is further based on another control signal.

17. A method comprising:
generating a delayed signal in response to an input signal;
providing a first voltage level to a node in response to a first control signal based on the input signal;
providing a second voltage level to the node in response to a second control signal based on the input signal and the delayed signal; and
boosting the voltage level of the node from the second voltage level to a bootstrapped voltage level in response to a third control signal based on the delayed signal.

18. The method, as recited in claim 17, further comprising:
causing the node to float in response to the first control signal and the second control signal,
wherein the voltage level is boosted to the bootstrapped voltage level while the node floats.

19. An apparatus comprising:
means for generating a delayed signal in response to an input signal;
means for providing a first voltage level to a node in response to a first control signal based on the input signal;
means for providing a second voltage level to the node in response to a second control signal based on the input signal and the delayed signal; and
means for boosting the voltage level of the node from the second voltage level to a bootstrapped voltage level in response to a third control signal based on the delayed signal.

* * * * *